United States Patent

Chen et al.

[11] Patent Number: 6,063,440
[45] Date of Patent: May 16, 2000

[54] METHOD FOR ALIGNING A WAFER

[75] Inventors: Ling Chen, Sunnyvale; Joseph Yudovsky, Palo Alto; Ying Yu, Cupertino; Lawrence C. Lei, Milpitas, all of Calif.

[73] Assignee: Applied Materials, Inc., Santa Clara, Calif.

[21] Appl. No.: 08/893,461

[22] Filed: Jul. 11, 1997

[51] Int. Cl.⁷ .................................................. C23C 16/00
[52] U.S. Cl. ....................... 427/248.1; 118/715; 438/689; 438/758
[58] Field of Search .................... 118/715, 723; 427/248.1; 438/689, 758

[56] References Cited

U.S. PATENT DOCUMENTS 5,326,725   7/1994   Sherstinsky et al. ................... 118/728
5,516,367   5/1996   Lei et al. ................... 118/725

OTHER PUBLICATIONS

U.S. application No. 08/564,398, Marohl et al., Nov. 29, 1995.
U.S. application No. 08/939,962, Lei et al., Nov. 29, 1997.

*Primary Examiner*—Timothy Meeks
*Assistant Examiner*—Sylvia R MacArthur
*Attorney, Agent, or Firm*—Thomason, Moser & Patterson

[57] ABSTRACT

A method for aligning a wafer on a support member within a vacuum chamber includes increasing the pressure within the vacuum chamber to at least about 1 Torr before aligning the wafer. The wafer is introduced into the vacuum chamber on the support member, the pressure is increased to at least about one Torr, and the support member is lifted into a shadow ring that has a frustoconical inner cavity constructed to funnel the wafer to a centered, aligned position.

15 Claims, 3 Drawing Sheets

METHOD FOR ALIGNING A WAFER

BACKGROUND OF THE INVENTION

1. Field of the Invention

The present invention relates to the field of semiconductor wafer processing equipment. More particularly, the present invention relates to a method and apparatus for aligning a wafer on a wafer support member.

2. Background of the Related Art

In the fabrication of integrated circuits, the various processes, such as physical vapor deposition (PVD), chemical vapor deposition (CVD), and etch processes, are often carried out in a vacuum environment to, among other things, reduce the particulate level to which the wafers are exposed. Wafers are introduced into a vacuum processing system through a loadlock where robots within the vacuum processing system move the wafers from the loadlock into a transfer chamber and then sequentially through the system positioning the wafers in a series of processing chambers.

The processing steps carried out within the vacuum chambers typically require the deposition, or etching of multiple metal, dielectric and semiconductor film layers on the surface of a wafer. During these processing steps, one must properly align and secure the wafer in the processing chamber in which the desired deposition or etch process is performed.

Typically, the wafer is supported in the chamber on a support member, commonly called a susceptor or pedestal. The wafer is placed on or secured to, the upper surface of the support member prior to the deposition or etch process. To ensure proper processing of the wafer, the wafer must be properly aligned relative to the support member. The position of the support member in the chamber is selected to provide a desired spacing and relative geometry between the generally planar surface of the wafer and other portions of the process chamber such as a gas plate in a CVD process or a target in a PVD process.

Generally, a shadow or clamp ring is used to shield the edge of a wafer and/or, in the case of a clamp ring, secure the wafer to the support member. Although the present invention is equally applicable to both shadow rings and clamp rings, the following description will refer primarily to shadow rings such as those typically used in CVD processes. In addition to acting as a shield, shadow rings also function in wafer capturing or alignment on the support member. Wing members extend downwardly and outwardly from the shadow ring to form a funnel. As the support member moves the wafer upward into the processing position, the support member moves the wafer into the funnel which directs the wafer into alignment with the shadow ring and the support member. Consequently, the funnel applies vertical and lateral forces to the wafer when the slanted wing members achieve lateral alignment of a misaligned wafer with the shadow ring and support member as the support member moves the wafer to the top end of the funnel and the shadow ring settles on the support member.

A primary goal of wafer processing is to obtain as many useful die as possible from each wafer. Many factors influence the processing of wafers in the chamber and effect the ultimate yield of die from each wafer processed therein including the existence of contaminants within the chamber that can attach to the wafer and contaminate one or more die therein. The processing chambers have many sources of particle contaminants which, if received on the wafer, reduce the die yield. One source of particulate contamination occurs when a misaligned wafer is introduced into the chamber. As the wing members of the shadow ring align with the wafer, the wafer slides on the flat surface of the support member and, due to the frictional forces between the wafer and the support member, may create particulate contaminants. In some cases, the frictional forces between the wafer and the support member cause the misaligned wafer to actually move the shadow ring, thereby preventing proper alignment of the wafer and reducing repeatability of the zone of exclusion shielded by the shadow ring and the process.

Prior efforts aimed at reducing the creation of particles have reduced the alignment movement of the wafer on the support member and simply increased the amount of overhang by the shadow ring. In this way, the shadow ring is able to cover the wafer without substantial movement of the wafer. One way that this is accomplished is by increasing the diameter of the shadow ring funnel upper end so that this diameter is larger relative to the diameter of the wafer and the support member. Thus, rather than substantially moving the wafers to align them, these systems simply accept a greater misalignment and accept greater coverage of the wafer upper surface area.

However, a second factor influencing the processing of wafers in the chamber and affecting the ultimate yield of die from each wafer processed therein is the repeatability of the positioning of the wafer and the area covered by the shadow ring. The wafer must be properly aligned relative to the support member and the shadow ring to ensure that the film is properly deposited on the wafer. Therefore, these prior efforts that avoid alignment of the wafer and cover more surface area are not acceptable.

It would, therefore, be desirable to provide a relatively simple system and method for reducing the coefficient of friction between the support member and the wafer that would allow alignment of the wafer without substantial particle generation.

SUMMARY OF THE INVENTION

In view of the foregoing, it is an object of the invention to provide a relatively simple apparatus and method for reducing the frictional forces between the support member and the wafer. It is another object of the invention to enhance repeatability and to provide a shadow ring that covers a minimal area of the upper surface of the wafer. Yet another object of the invention is to provide a system and method for aligning a wafer that is relatively inexpensive, efficient, simple to implement, and reliable. Other objects of the invention will become apparent from time to time throughout the specification and claims as hereinafter related.

The present invention provides methods and apparatuses for aligning a wafer on a support member in a vacuum chamber. In one aspect of the invention, the method comprises the steps of introducing the wafer into the vacuum chamber, increasing the pressure within the vacuum chamber and moving the wafer into alignment with a support member and/or shadow ring.

In another aspect, the method comprises providing a shadow ring having a lower portion that is outwardly tapered for receipt of a wafer and an upper aperture having a diameter that is slightly less than the outer diameter of the wafer, introducing the wafer into the vacuum chamber and onto the support member, increasing the pressure within the chamber, and subsequently moving the support member towards the shadow ring so that the shadow ring aligns the wafer on the support member.

In accordance with the methods, the apparatus for aligning a wafer on a support member in a vacuum chamber is an apparatus comprising a support member positioned within the vacuum enclosure and having a wafer receiving surface thereon, a shadow ring located within the vacuum chamber, a gas supply in fluid communication with the vacuum chamber, and a gas flow controller that controls the flow of gas to the vacuum chamber and, thereby, regulates the pressure within the vacuum chamber such that, after the wafer is positioned on the support member and before the wafer is raised into the shadow ring, the control member raises the pressure within the chamber to about 1 Torr. The shadow ring used in this apparatus comprises an upper shield portion defining a circular aperture therethrough, the circular aperture having a diameter that is slightly less than the outer diameter of the wafer, a lower portion extending from the upper shield portion having an annular cross section defining a frustoconical inner cavity, the diameter of the inner cavity decreases from a lower mouth aperture to an upper end, and the diameter of the upper end of the inner cavity is slightly greater than the outer diameter of the wafer.

In each of these methods and apparatuses, the pressure is preferably raised to a pressure greater than about 1 Torr and more preferably to a pressure between about 1 Torr and 100 Torr and most preferably between about 1 Torr and 10 Torr. Further, the pressure is raised is to approximately equal to or less than the process pressure. Also, the pressure between the wafer and the support member is preferably equal to or greater than the pressure in the chamber before the wafer is aligned.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
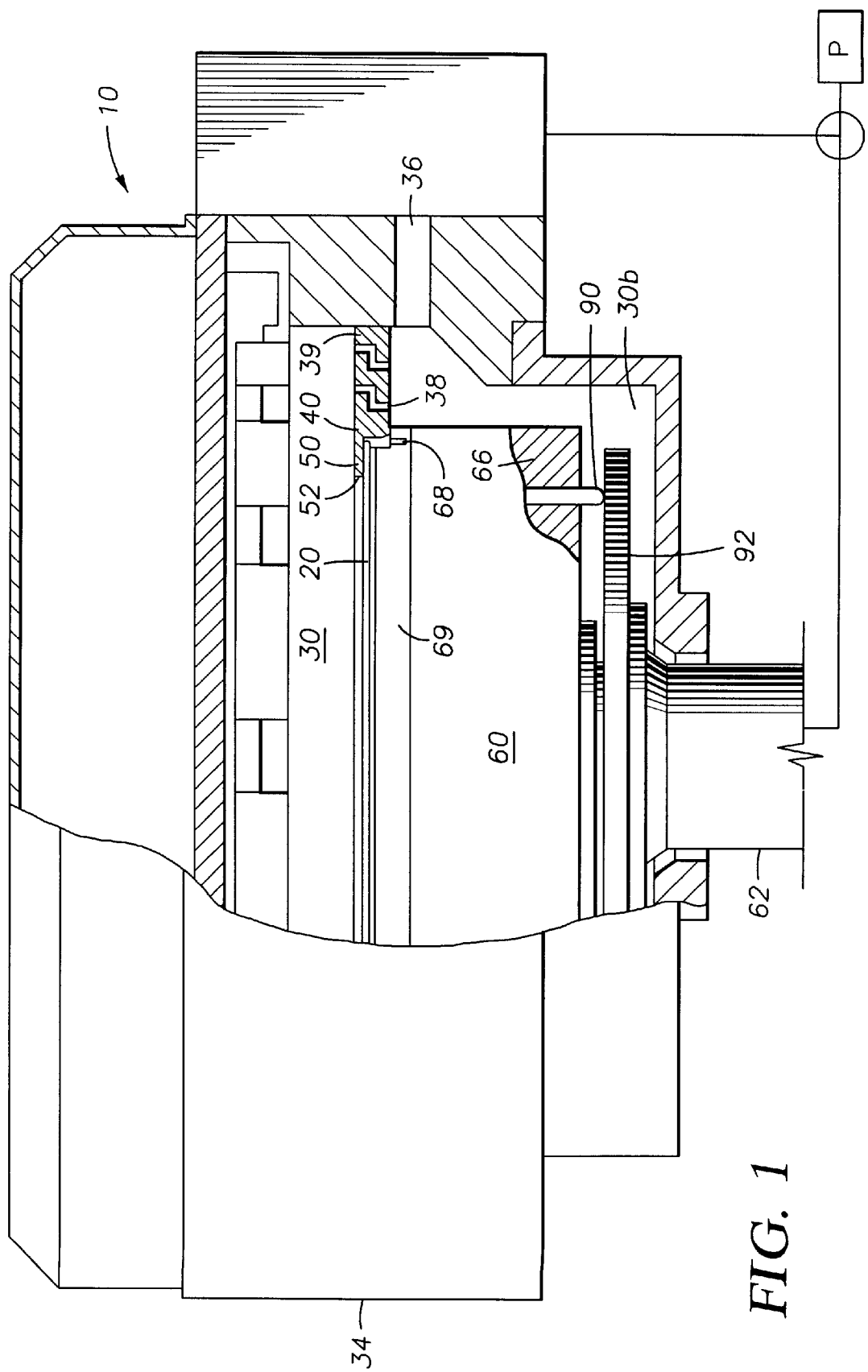
FIG. 1 is a partial cross sectional view of the vacuum chamber.

As shown in FIG. 1, the present invention relates to a method and apparatus for aligning a wafer 20 on a support member 60 in a vacuum chamber 30. The alignment apparatus is depicted generally as 10.

The preferred embodiment described below refers to an alignment apparatus 10 that uses a shadow ring 40 to align the wafer 20 on the support member 60. However, the invention is not limited to this precise form of apparatus for it may apply to any number of alignment mechanisms. As previously mentioned, the term "shadow ring," as used herein, refers generally to both shadow rings and clamp rings.

FIG. 1 shows a typical vacuum chamber 30 defined by an outer body 34. The vacuum chamber 30 houses a support member 60 that may take the form of a pedestal or susceptor mounted on a generally vertically oriented shaft 62. The support member 60 serves to support a wafer 20 on its flat upper supporting surface 69. The support member 60 also includes a step formation 68 formed on its outer perimeter to receive and support a shadow ring 40 and includes four finger apertures 66.

Figure 2:
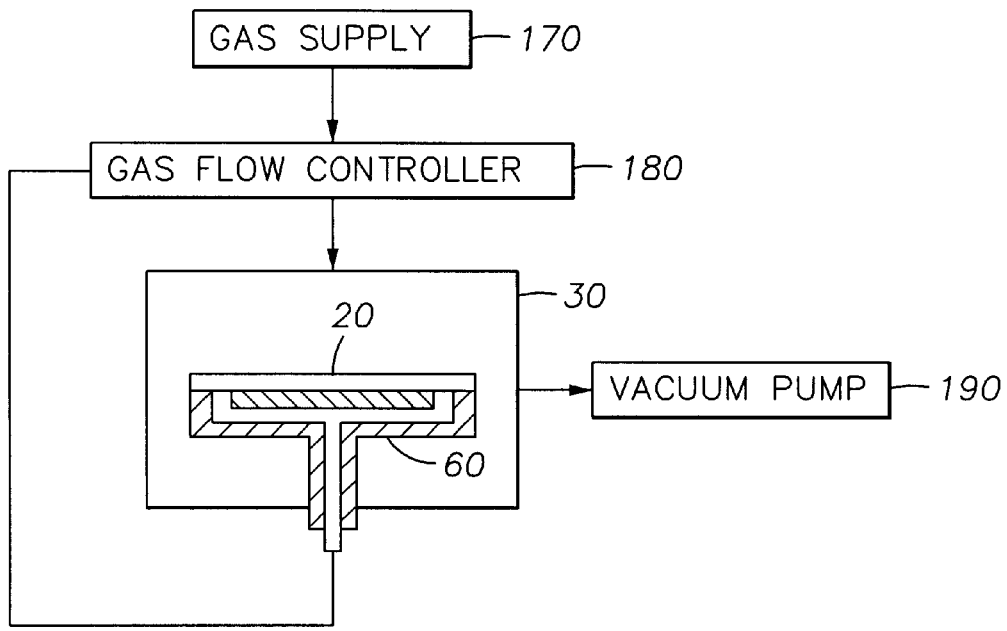
FIG. 2 is a schematic drawing of the vacuum chamber and the pressure control system.

In a typical vacuum chamber 30, the pressure within the vacuum chamber 30 is controlled by a pressure control system such as the one shown schematically in FIG. 2. In this system, a gas supply 170 is provided in fluid communication with the vacuum chamber 30. A gas flow controller 180 positioned intermediate the gas supply 170 and the vacuum chamber 30 controls the flow from the gas supply 170 to the vacuum chamber 30. Using a predetermined set of instructions, the gas flow controller 180 selectively provides a flow of gas to the vacuum chamber 30. As the gas flows into the vacuum chamber 30, the pressure within the vacuum chamber 30 increases. In this way, the gas flow controller 180 controls the pressure within the vacuum chamber 30. It is possible to provide the gas to the chamber 30 through the support member 60 to the back side of the wafer 20. When provided to the back side of the wafer 20, the gas creates a pressure between the wafer 20 and the support member 60 that is initially greater than the pressure in the chamber 30. This back side gas may be provided, for example, by a bypass line 200 that provides communication from the gas flow controller 180 to the upper surface 64 of the support member 60 between the support member 60 and the wafer 20.

FIG. 1 also illustrates a wafer lifting finger 90 received in a finger aperture 66 passing through the body of the support member 60. Typically, the processing chamber would include four such lifting fingers 90. These lifting fingers 90 operate to lift the wafer 20 clear of the upper supporting surface 69 of the support member 60 after processing. This removal of the wafer 20 is achieved by means of a conventional processing apparatus robot arm (not shown) which enters the vacuum chamber 30 through the slit valve opening 36. The same robot arm is also used to insert the wafers 20 into the vacuum chamber 30. The lifting fingers 90 are movable vertically under action of a lifting mechanism 92 of which only the upper portion is shown.

A shadow ring 40 housed within the vacuum chamber 30 operates to provide an exclusionary zone where no deposition occurs at the edge of the wafer 20. The shadow ring 40 also operates to force a misaligned wafer 20 into alignment as the support member 30 moves from a lowered, or idle, position to a raised, or processing, position. When the support member 30 is in the lowered position, the shadow ring 40 is supported around its perimeter by an outer support ring 38 that is, in turn, supported by a conventional pumping plate 39 attached to the vacuum chamber 30. Together, the two rings, 40 and 38, divide the vacuum chamber 30 into upper and lower sections, 30a and 30b respectively.

During processing, the support member 60 moves upward into a raised position lifting the shadow ring 40. The shadow ring 40 has a lower portion 42 that rests on the upper surface 69 of the support member 60 and supports the upper shield portion 50 of the shadow ring 40 above the upper surface of the wafer 20. Preferably, the shield portion 50 is held about 5 to 10 mils above the wafer 20. The upper shield portion 50 of the shadow ring 40 defines a circular upper aperture 46 therethrough. The diameter of the upper aperture 46 may be slightly less than the outer diameter of the wafer 20 to form the exclusionary zone on the wafer 20. However, new processes may require no overhang of the shadow ring 40 over the wafer 20. In one typical processing operation, the step formation 68, shown in FIG. 1, is in the range of 3.8 to 3.9 mm high, the shadow ring 40 is in the range of 5 to 5.1 mm thick, and the overhanging portion is in the range of 0.8 to 0.9 mm thick. The overhanging portion defines an exclusionary zone of about 3 to 5 mm about the edge of the wafer 20. However, in the preferred embodiment, this exclusionary zone is no greater than 1.5 mm from the edge of the wafer 20. To accommodate the current industry standards, the exclusionary zone at any one edge is preferably about 1.5 mm or less. This relatively small exclusionary zone is necessary to allow deposition on the wafer 20 at a position 1.5 mm from the wafer edge. Industry standards demand a film thickness at 1.5 mm from the wafer edge that is at least 90 percent of the film thickness at the wafer center. No deposition is allowed on the beveled edge of the wafer 20. Therefore, for a typical wafer 20 having a 0.5 mm chamfer about its edge, this allows a deviation of only about 1 mm from center. As used herein, all dimensions account for thermal expansion and are representative of measurements at process temperatures.

Preferably, a purge gas is directed through the support member 60 about the periphery of the wafer 20. The purge gas flows between the shadow ring 40 and the wafer 20 to help shield the exclusionary zone of the wafer 20.

Figure 4:
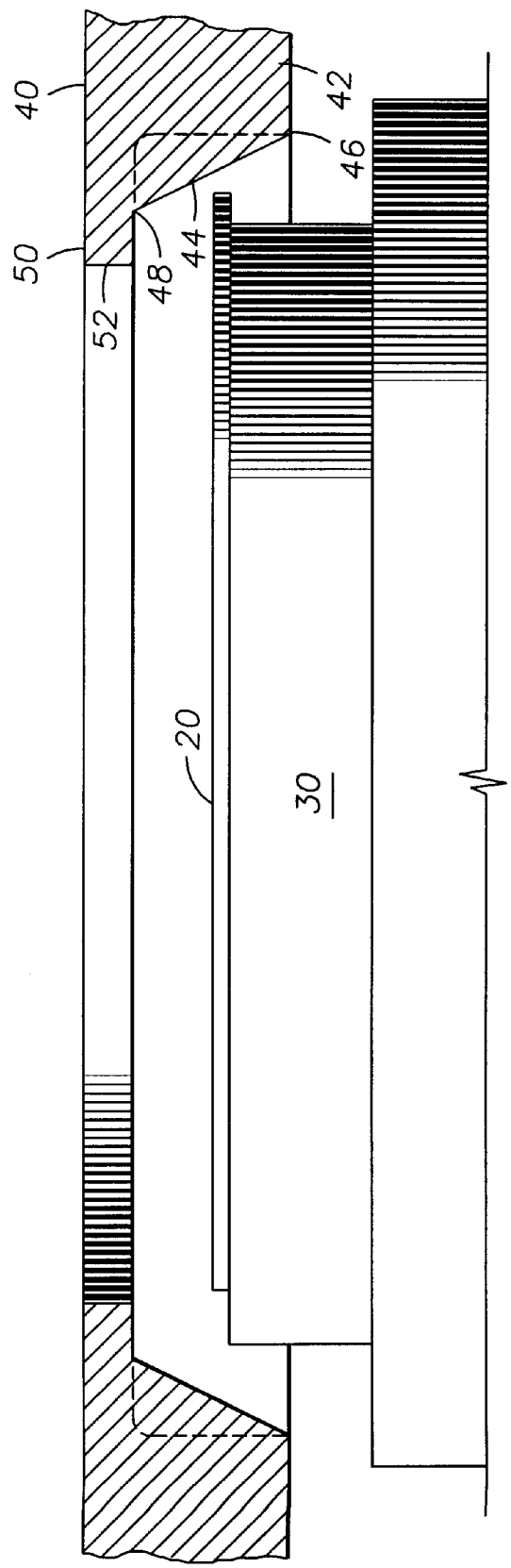
FIG. 4 is a partial, cross sectional view of a shadow ring, a wafer, and a support member showing the wafer misaligned on the support member as they enter the inner cavity of the shadow ring.

A lower portion 42 of the shadow ring 40, as shown in FIG. 4, extends downwardly from the upper shield portion 50. The lower portion 42 has an annular cross section throughout its length and defines a frustoconical inner cavity 44 therein that is concentric with the upper aperture 52. Because wafers 20 are circular in shape, the support member 60 is circular as is the inner cavity cross section. The diameter of the inner cavity 44 decreases from the lower mouth portion 46 to the upper end 48 of the inner cavity 44 to form a funnel-like structure for aligning the wafer 20 on the support member 60. Accordingly, the surface of the inner cavity 44 is relatively smooth to facilitate the sliding receipt and abutment of the wafer 20 in the inner cavity 44. To allow receipt of the wafer within inner cavity 44 and to properly align the wafer 20 with the shadow ring 40, the diameter of the upper end 46 of the inner cavity 44 is slightly greater than and, preferably, approximately equal to the outer diameter of the wafer 20. As previously mentioned, current industry practice demands that the thickness of the deposited film at a position 1.5 mm from the edge of the wafer 20 be 90 percent of the thickness at the center of the wafer 20. Accordingly, the wafer 20 must be aligned so that the shadow ring overhangs the wafer 20 by no more than 1.5 mm about its full periphery so that the film will be allowed to deposit on the wafer 20 at 1.5 mm from the edge of the wafer 20. Therefore, the diameter of the upper end 46 of the inner cavity 44 is preferably at most only slightly more than 3 mm greater than the upper aperture 52 and only slightly greater than the outer diameter of the wafer 20 to ensure that the edge of the wafer 20 is within 1.5 mm of the periphery of the upper aperture 52. In this way, the shadow ring 40 only overhangs the wafer 20 at most by about 1.5 mm about the full periphery of the wafer 20. Because the wafer 20 rests on the upper surface 64 of the support member 60 and the wafer 20 is relatively thin, the outer diameter of the support member 60 must be sufficiently small that it can also be positioned proximal the upper end 52 of the inner cavity 44. However, to provide proper support for the wafer 20, the support member 60 must cover substantially the full area of the wafer 20. Therefore, the wafer must occupy most of the upper surface area of the support member 60.

As shown in FIG. 1, once positioned in the vacuum chamber 30, a wafer 20 rests on the upper supporting surface 69 of the support member 30. This placement is made with the support member 60 in its lowered position. Before processing may begin, the wafer 20 must first be raised by the support member 60 to the raised position. It is during the movement from the lowered position to the raised position that any misalignment of the wafer 20 is corrected and the wafer 20 is aligned. As the support member 60 moves upward from the lowered position, a misaligned wafer 20 contacts the inner cavity 44 of the shadow ring 40 at a position intermediate the upper end 48 and the lower mouth portion 46. FIG. 4 illustrates a misaligned wafer 20 on the support member 60. The point of contact is dependent upon the magnitude of the misalignment. Preferably, there is no misalignment. As the support member 60 continues to move upward, the angled side of the frustoconically-shaped inner cavity 44 exerts a lateral force on the edge of the wafer 20 forcing the wafer 20 into alignment. Consequently, when the support member 60 reaches its raised position so that the wafer 20 is at the upper end 48 of the inner cavity 44 of the shadow ring 40, the wafer 20 is aligned due to the relative diameters of the wafer 20 and the shadow ring components. When in this raised position, depending upon the type of process involved, the outer portion of the wafer 20 may either bear against the shadow ring 40 and slightly lift the shadow ring 40 under action of the support member 60 or may rest on the shoulder 68 of the support member 60 and, thereby, leave a small gap between the shadow ring 40 and the wafer 20. For convenience, the application refers primarily to those processes wherein the wafer 20 does not contact the shadow ring 40 although the present invention is applicable to all processes. With the support member 60 in the raised position, the outer portion of the wafer 20 is covered by the upper shield portion 50 of the shadow ring 40.

However, as mentioned previously, the sliding movement of the wafer 20 on the support member 60 during alignment creates particles within the vacuum chamber 30. These particles are generated as a result of the friction between the wafer 20 and the support member 60 which is generally characterized by the coefficient of friction of the interface multiplied by the weight of the wafer 20. Other forces acting upon the wafer 20 also affect the magnitude of the frictional forces. For example, vacuum chucking may affect the friction between the wafer 20 and the support member 60. Likewise, the downward component of the force exerted by the frustoconical inner cavity 44 increases the frictional forces between the abutting surfaces. Nevertheless, the friction force between the surfaces equals the coefficient of friction between the surfaces multiplied by the downward, normal forces exerted on the wafer 20 whatever their source. Generally, the weights of the wafers 20 are relatively constant. Greater frictional forces on the wafer 20 and the support surface 60 cause greater particle generation and decrease the energy efficiency of the system. In addition, high frictional forces may cause misalignment and may cause the wafer 20 to move the shadow ring 40 out of alignment, rather than the shadow ring 40 moving the wafer 20 into alignment, if the lateral force applied on the wafer 20 by the shadow ring is insufficient to overcome the frictional forces. For the purposes of the present application, the relevant normal and frictional forces are generally characterized by the following formulas respectively wherein N represents the normal force applied to the wafer 20, F is the frictional force applied to the wafer 20, G is the weight of the wafer 20, A is the surface area of the wafer 20, $P_1$ is the pressure in the chamber 30, $P_0$ is the pressure between the wafer 20 and the support member 60, and $\mu$ is the coefficient of friction.

$$N = G - (P_1 - P_0)A$$

$$F = \mu N = \mu(G - (P_1 - P_0)A)$$

Thus, the normal force is equal to the weight of the wafer 20 less the force created by the pressure differential on the top and bottom surfaces of the wafer 20. The force created by this pressure differential equals the difference between the pressure between the wafer 20 and the support member 60 and the pressure in the chamber 30 multiplied by the surface area of the wafer 20. The frictional forces equal the normal forces multiplied by the coefficient of friction.

Reducing the frictional forces between the wafer 20 and the support member 60 reduces the number of particles generated when the wafer 20 is moved on the support member 60. Accordingly, in order to reduce the number of particles generated, the coefficient of friction or the normal force between the wafer 20 and the support member 60 must be reduced. The present invention accomplishes this by increasing the pressure within the vacuum chamber 30 to at least about one Torr. Empirical studies, which are more fully discussed below, have shown that increasing the pressure within the vacuum chamber 30, so that the pressure between the wafer 20 and the support member 60 is equal to or greater than the pressure in the vacuum chamber 30, reduces the frictional forces between the wafer 20 and the support member 60. In order for this decrease in frictional force to occur, one of two things must happen. One possibility is that the increased pressure somehow lowers the coefficient of friction (e.g., by possibly creating a cushion of gas between the wafer 20 and the support member 60). Another possibility is that the increased pressure somehow lowers the normal force on the wafer 20. Regardless of the manner in which increasing the pressure affects the frictional forces, the result is that the frictional forces are reduced and, thus, the wafer 20 may be moved on the support member 60 with less resistance and less particle generation. The resulting decrease in frictional force allows freer movement of the wafer 20 on the support member 60 and, thereby, reduces the resulting scratches and generated particles. Gas from the gas supply 170 is introduced into the vacuum chamber 30 to increase the pressure therein. The gas may be introduced generally into the chamber 30 or through gas inlets positioned in the upper surface 69 of the support member 60. It is in this latter case that the pressure below the wafer 20 is greater than the pressure above the wafer 20.

Therefore, the method of the present invention involves increasing the pressure within the vacuum chamber 30 to at least about one Torr before moving the wafer 20 on the support member 60 for alignment. Typically, the pressure within the vacuum chamber 30 when the wafer 20 is introduced therein is about one milliTorr or less. The wafer is, thus, introduced into the vacuum chamber 30 onto the support member 60 which is in a lowered position. The support member 60 is then raised to the lower mouth aperture 46 of the shadow ring 40. However, before raising the support member 60 to the processing position the pressure within the vacuum chamber 30 is increased to at least about one Torr. Of course, this step of increasing the pressure may take place at any time before the support member 60 is raised into the inner cavity 44 of the shadow ring 40. Preferably, the pressure is raised to between about 1 Torr and 100 Torr or, more preferably, between about 1 Torr and 10 Torr and approximately equal to or less than the operating pressure of the process. The operating pressure of the process is the pressure at which the process, such as a chemical vapor deposition process, is carried out in the vacuum chamber 30. Also, before raising the support member 60 to the raised position, the pressure between the wafer 20 and the support member 60 is provided so that the pressure between the wafer 20 and the support member 60 is approximately equal to or greater than the pressure in the vacuum chamber 30. Once the pressure in the vacuum chamber 30 is sufficiently raised and the pressure beneath the wafer 20 is equalized, the support member 60 is raised to the raised, or processing, position. As previously discussed, when the support member 60 moves into the shadow ring 40, any misaligned wafer 20 will contact the angled sides of the inner cavity 44 which will force the wafer 20 into alignment. After the support member 60 is in the raised position and the wafer 20 is aligned, the pressure within the vacuum chamber 30 may be altered as needed.

As previously described, the pressure within the vacuum chamber 30 is manipulated by a gas supply 170 and a gas flow controller 180. In operation, the gas flow controller 180 uses predetermined set of instructions to adjust the pressure within the vacuum chamber 30 as needed. A vacuum pump 190, or series of vacuum pumps 190, are used to evacuate the vacuum chamber 30.

EXAMPLE

This system has been tested to determine its effectiveness as follows. A misaligned wafer 20 was positioned upon a support member 60 in a vacuum chamber 30 and was raised from a lowered position to a raised position. The test was conducted under vacuum conditions (i.e., moving the wafer 20 without first increasing the pressure in the chamber) and under pressurized conditions (i.e., moving the wafer 20 only after increasing the pressure in the chamber). When tested under pressurized conditions, the tests were conducted with both the pressure beneath the wafer 20 equal to and greater than the pressure in the chamber 30. In both of these pressurized condition tests, the results were essentially the same. The wafers 20 were then inspected using a SURISCAN 6200 manufactured by Tencor Instruments to determine the number of particles generated as a result of the wafer 20 moving on the support member 60. The results revealed that, without first increasing the pressure in the chamber, alignment of the wafer generated approximately 50 to 200 particles when the wafer 20 contacted the shadow ring and approximately 5000 backside particles. In addition, without first increasing the pressure in the chamber, the shadow ring 40 often moved with the wafer 20 as the support member 60 lifted the shadow ring 40 due to the frictional forces holding the wafer 20 to the support member 60. This resulted in a misaligned wafer 20 and reduced repeatability of the process. However, using the present invention, wherein the pressure is raised to at least about one Torr before moving the wafer 20, the movement of the wafer 20 on the support member 60 generated only approximately Twenty (20) particles when the wafer 20 contacted the shadow ring 40 and less than 2000 backside particles. Further, the misaligned wafer 20 moved on the support member 60 more readily and was, therefore, properly centered which increased repeatability of the edge exclusion and the process.

While the foregoing is directed to the preferred embodiment of the present invention, other and further embodiments of the invention may be devised without departing from the basic scope thereof, and the scope thereof is determined by the claims which follow.

What is claimed is:

1. A method for aligning a wafer within a vacuum chamber, comprising:

introducing the wafer into the vacuum chamber;

then increasing the pressure within the vacuum chamber; and after increasing the pressure within the vacuum chamber, moving the wafer into alignment with a support member and/or a shadow ring.

2. The method of claim 1, wherein the pressure in the vacuum chamber when the wafer is introduced therein is 1 milliTorr or less.

3. The method of claim 1, further comprising increasing the pressure in the vacuum chamber to about 1 Torr.

4. The method of claim 1, further comprising increasing the pressure in the vacuum chamber to a pressure that is at least about 1 Torr and less than an operating pressure.

5. The method of claim 1, further comprising increasing the pressure in the vacuum chamber to a pressure between about 1 Torr and 100 Torr.

6. The method of claim 1, further comprising increasing the pressure in the vacuum chamber to a pressure between about 1 Torr and 10 Torr.

7. The method of claim 1, further comprising waiting until the pressure beneath the wafer is equal to or greater than the pressure in the vacuum chamber before aligning the wafer.

8. A method for aligning a wafer on a support member within a vacuum chamber, comprising:

providing a shadow ring having a lower portion that is outwardly tapered for receipt of the wafer and an upper aperture having a diameter that is slightly less than the outer diameter of the wafer;

introducing the wafer into the vacuum chamber and onto the support member;

increasing the pressure within the chamber; and subsequently moving the support member toward the shadow ring so that the shadow ring aligns the wafer on the support member.

9. The method of claim 8, wherein the pressure in the vacuum chamber when the wafer is introduced therein is 1 milliTorr or less.

10. The method of claim 8, further comprising increasing the pressure in the vacuum chamber to a pressure about 1 Torr.

11. The method of claim 8, further comprising increasing the pressure in the vacuum chamber to a pressure that is at least about 1 Torr and less than an operating pressure.

12. The method of claim 8, further comprising increasing the pressure in the vacuum chamber to a pressure between about 1 Torr and 100 Torr.

13. The method of claim 8, further comprising increasing the pressure in the vacuum chamber to a pressure between about 1 Torr and 10 Torr.

14. The method of claim 8, further comprising waiting until the pressure beneath the wafer is equal to or greater than the pressure in the vacuum chamber before aligning the wafer.

15. The method of claim 8, further comprising raising the wafer to a position below the shadow ring before increasing the pressure within the chamber.

* * * * *

UNITED STATES PATENT AND TRADEMARK OFFICE
CERTIFICATE OF CORRECTION

PATENT NO : 6,063,440

DATED : May 16, 2000

INVENTOR(S): Chen et al.

It is certified that error appears in the above-identified patent and that said Letters Patent are hereby corrected as shown below:

On page 1, figure 1, please delete "66".

Figure 3:
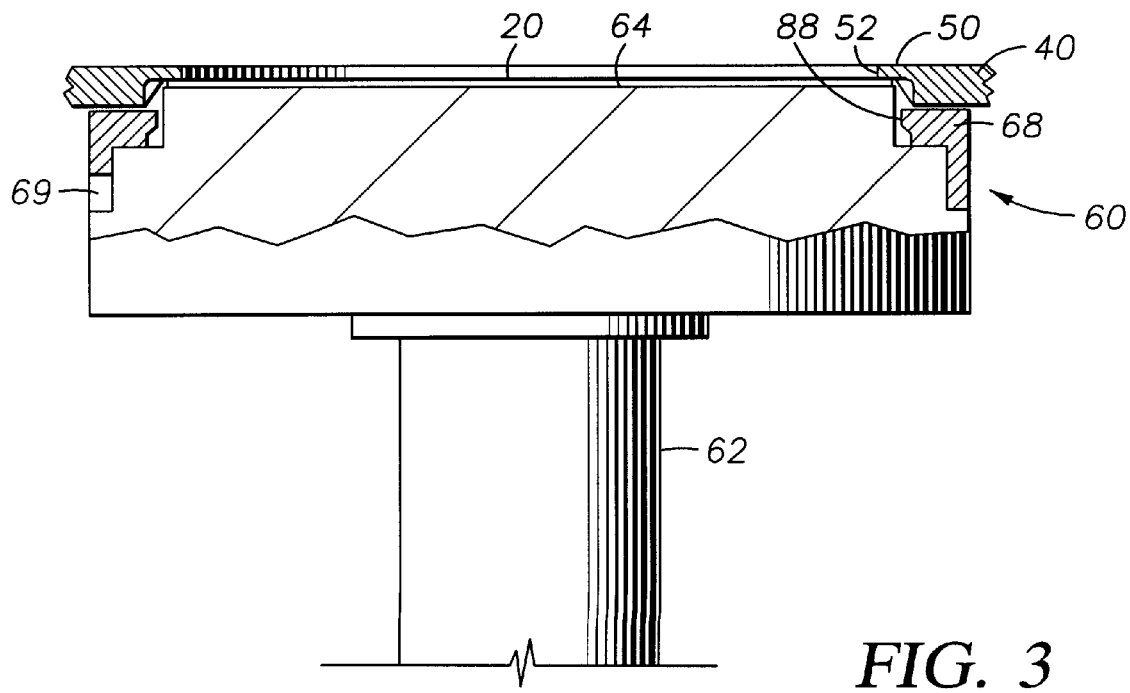
FIG. 3 is a cross sectional view of a typical support member having a wafer thereon that is partially covered by a shadow ring.

In column 4, line 1, after "Fig. 1", please insert -- and Fig. 3 --.

In column 4, line 6, please replace "69" with -- 64 --.

In column 4, line 9, please replace "66" with -- 69 --.

In column 4, line 34, please replace "66" with -- 69 --.

In column 4, line 38, please replace "69" with -- 64 --.

In column 4, line 61, please replace "69" with -- 64 --.

In column 6, line 3, please replace "69" with -- 64 -- .

In column 6, line 11, after "44", please replace "ofthe" with -- of the --.

In column 7, line 48, please replace "69" with -- 64 --.

Signed and Sealed this

First Day of May, 2001

Attest:

NICHOLAS P. GODICI

Attesting Officer     Acting Director of the United States Patent and Trademark Office